United States Patent
Horan

(10) Patent No.: US 6,643,171 B2
(45) Date of Patent: Nov. 4, 2003

(54) HIGH DYNAMIC RANGE RECORDING AND PLAYBACK FOR MULTILEVEL STORAGE USING DIFFERENTIAL SAMPLING

(75) Inventor: Douglas F. Horan, Los Gatos, CA (US)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 10/011,357

(22) Filed: Nov. 6, 2001

(65) Prior Publication Data

US 2003/0086289 A1 May 8, 2003

(51) Int. Cl.[7] .............................................. G11C 7/00
(52) U.S. Cl. .................. 365/185.03; 365/205; 365/207; 365/189.07; 365/196
(58) Field of Search ...................... 365/185.01, 185.03, 365/189.01, 189.07, 196, 205, 207

(56) References Cited

U.S. PATENT DOCUMENTS

| | | | | |
|---|---|---|---|---|
| 4,511,830 A | * | 4/1985 | Yamada et al. ............. | 318/318 |
| 4,574,250 A | * | 3/1986 | Senderowicz ............... | 330/258 |
| 4,779,055 A | * | 10/1988 | Beauducel et al. .......... | 330/51 |
| 4,890,259 A | * | 12/1989 | Simko ......................... | 365/45 |
| 5,238,679 A | * | 8/1993 | Cyprien et al. ............. | 359/154 |
| 5,345,471 A | * | 9/1994 | McEwan ...................... | 375/1 |
| 5,715,238 A | * | 2/1998 | Hall et al. ................... | 370/242 |
| 6,242,978 B1 | * | 6/2001 | Danielsons .................. | 330/149 |
| 6,438,366 B1 | * | 8/2002 | Lindfors et al. ............ | 455/334 |

FOREIGN PATENT DOCUMENTS

| JP | 35816119 A | * | 9/1983 | .......... H03K/13/02 |
|---|---|---|---|---|

* cited by examiner

*Primary Examiner*—Viet Q. Nguyen
(74) *Attorney, Agent, or Firm*—Blakely, Sokoloff, Taylor & Zafman LLP

(57) ABSTRACT

In one embodiment of the present invention, a technique is provided to store and retrieve analog signals. A write circuit comprises a sampler, a circuit, and a differential amplifier. The sampler samples an input signal to generate a first sample of an input signal at a first time instant. The circuit generates a second sample which is the sampled input signal held at a second time instant. The differential amplifier generates a difference signal representing a difference between the first sample and the second sample. The difference signal is stored in a multilevel storage array. A read circuit comprises a sample-and-hold device, a summing amplifier, and a circuit. The sample-and-hold device is coupled to a multilevel storage array to generate a first sample stored in the multilevel storage array at a first time instant. The summing amplifier generates a sum signal representing a sum between the first sample and a second sample. The circuit generates the second sample at a second time instant.

27 Claims, 6 Drawing Sheets

HIGH DYNAMIC RANGE RECORDING AND PLAYBACK FOR MULTILEVEL STORAGE USING DIFFERENTIAL SAMPLING

BACKGROUND

1. Field of the Invention

This invention relates to analog storage. In particular, the invention relates to multilevel analog storage.

2. Description of Related Art

Analog storage has been popular recently due to advances in analog signal processing. Applications of analog storage include recording and playback of analog voice signals.

Traditional techniques record analog signals by sampling and storing a sampled analog voltage value on a charging element, e.g., a capacitor, which forms the gate of an electrically erasable programmable read only memory (EEPROM) or a flash memory device. The sampled analog voltage is stored in its entire normalized value voltage referenced to ground. In part, level shifting, companding, and other analog signal processing are performed on the normalized signal to faithfully record and playback the complete signal. Detection technology has limited the resolution to a maximum of about 48 dBm or 8 bits (for digitized samples) of dynamic range. This dynamic range is not sufficient for use in many high resolution applications.

Therefore, there is a need to have an efficient technique to increase the dynamic range for high resolution analog storage.

SUMMARY

In one embodiment of the present invention, a technique is provided to store and retrieve analog signals.

A write circuit comprises a sampler, a first hold circuit, a second hold circuit, and a differential amplifier. The sampler captures an instantaneous value of the voltage present during a particular time period of an input signal. The first hold circuit holds the sample value after the sample period. The second hold circuit may either alternate with the first hold circuit to store a second new sample or may be transferred the sample from the first hold circuit. One method uses an analog switch or a transfer gate when the first held value is ready to be replaced by the next value. The differential creates a voltage which is the analog difference between the two held values.

A read circuit is similar to the write circuit except that the differential amplifier is replaced by a summing amplifier.

BRIEF DESCRIPTION OF THE DRAWINGS

The features and advantages of the present invention will become apparent from the following detailed description of the present invention in which.

DESCRIPTION

In one embodiment of the present invention, a technique is provided to store and retrieve analog signals to provide high dynamic range. The technique uses an input circuit to store the analog signal using the successive differences of the signal samples. When the samples are read, the original signal samples are reconstructed using the difference samples and the initial sample. The initial sample may be a reference signal if the first sample is out of range. The first stored signal is either zero or the reference signal. The technique includes a write circuit to generate the difference signal samples and a read circuit to reconstruct the original samples.

A write circuit comprises a sampler, a first hold circuit, a second hold circuit, and a differential amplifier. The sampler captures an instantaneous value of the voltage present during a particular time period of an input signal. The first hold circuit holds the sample value after the sample period. The second hold circuit may either alternate with the first hold circuit to store a second new sample or may be transferred the sample from the first hold circuit. One method uses an analog switch or a transfer gate when the first held value is ready to be replaced by the next value. The differential creates a voltage which is the analog difference between the two held values.

A read circuit is similar to the write circuit except that the differential amplifier is replaced by a summing amplifier.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
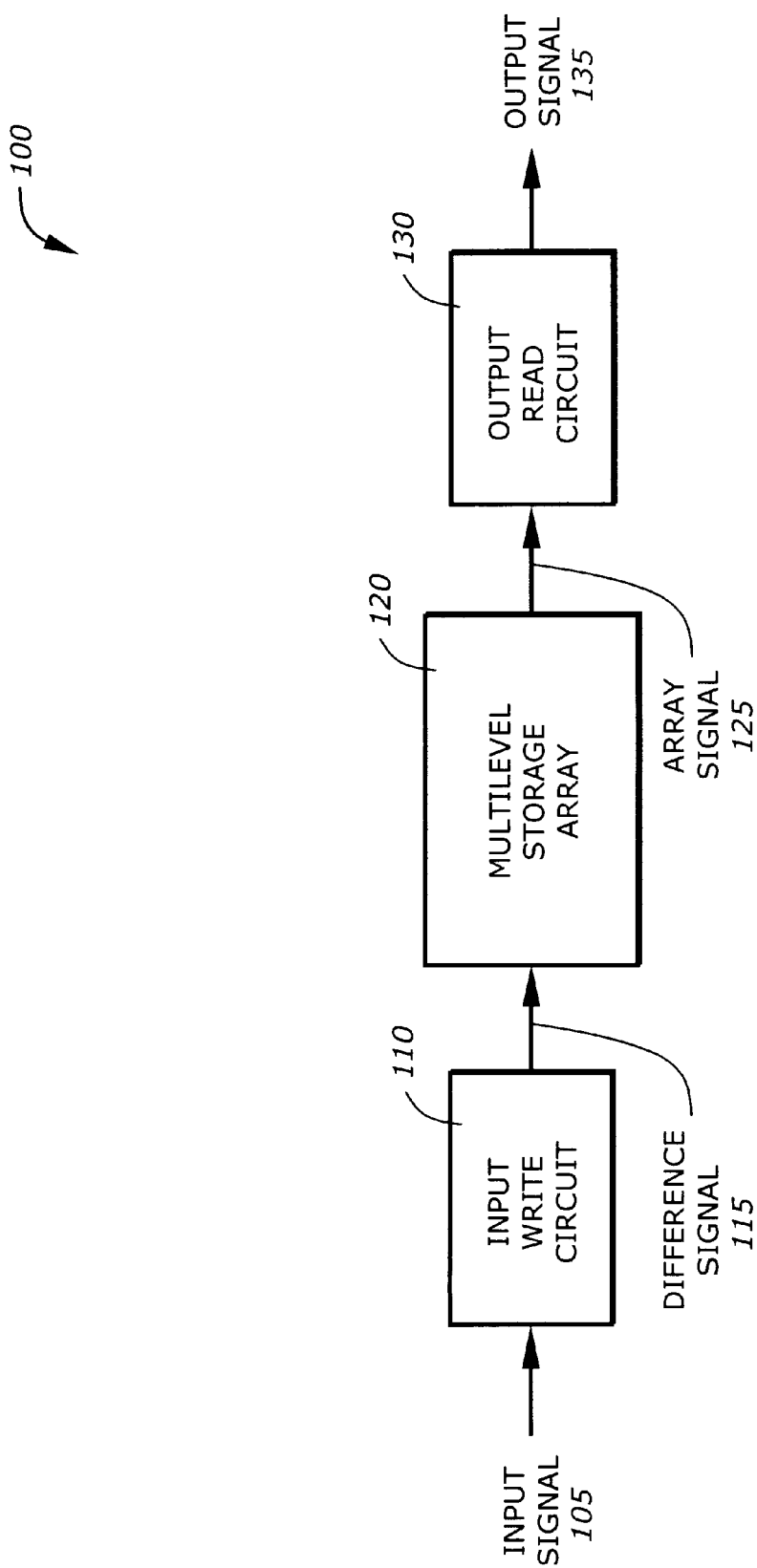
FIG. 1 is a diagram illustrating a system in which one embodiment of the invention is practiced.

FIG. 1 is a diagram illustrating a system 100 in which one embodiment of the invention is practiced. The system 100 includes an input circuit 110, a multilevel storage array 120, and an output circuit 130. The system 100 is typically used in an analog recording and playback circuit.

The input circuit 110 receives an input signal 105 and generates a difference signal 115. The input signal 105 is an analog signal that is stored in the storage array 120. The input circuit 110 samples the input signal 105 and computes the difference between two successive samples which are sampled at two consecutive time instants. The difference of the two samples is the difference signal 115 to be stored in the storage array 120. The first sample stored may be a reference signal.

The storage array 120 is an analog storage array. The storage array 120 typically has a write circuit, a read circuit, and a memory array. The write circuit writes the difference signal 115 to the memory array. The read circuit retrieves the stored samples.

The output circuit 130 receives the stored difference samples from the storage array 120 and generates an output signal 135. The output circuit 130 reconstructs the original input samples from the difference samples. The output signal 135 corresponds to the original input samples.

Figure 2A:
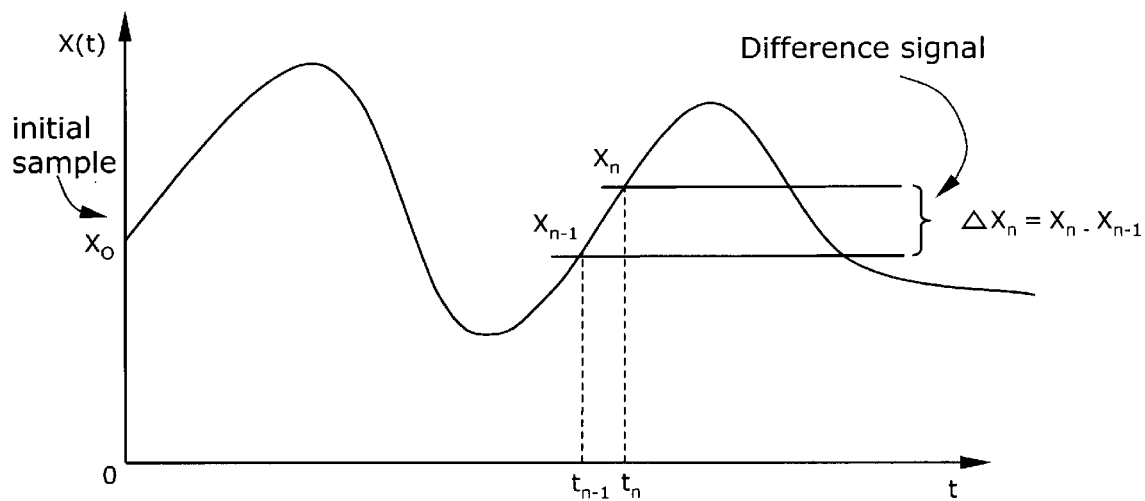
FIG. 2A is a diagram illustrating a difference signal according to one embodiment of the invention.

FIG. 2A is a diagram illustrating a difference signal according to one embodiment of the invention. The diagram shows an analog signal x(t) as a function of time t.

The signal x(t) is sampled by a sampling circuit at discrete time instants. The signal x(t) has the initial sample x0 at some time reference t=0. The signal x(t) has samples $x_{n-1}$ and $x_n$ at time instants $t_{n-1}$ and $t_n$ respectively. The difference signal, or difference sample, $\Delta x_n$ is equal to the difference between the two samples $x_{n-1}$ and $x_n$: $\Delta x_n = t_n - t_{n-1}$.

By storing the difference of two consecutive samples, the dynamic range of the signal to be stored is increased. This is because the difference of two consecutive samples tend to have a smaller magnitude than the samples.

Figure 2B:
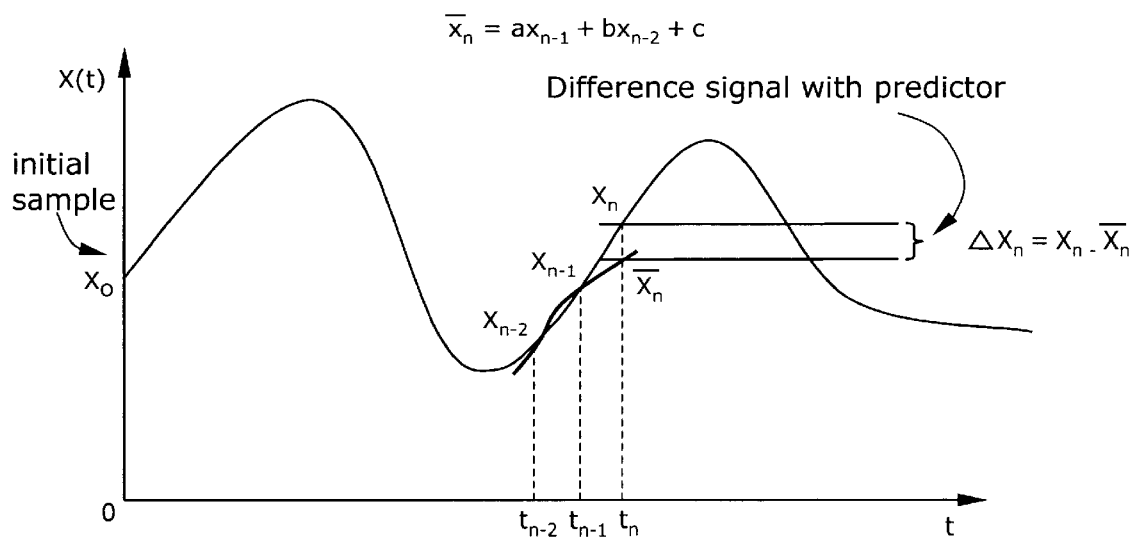
FIG. 2B is a diagram illustrating a difference signal using a predictor on two samples according to one embodiment of the invention.

FIG. 2B is a diagram illustrating a difference signal using a predictor on two samples according to one embodiment of the invention. The diagram shows an analog signal x(t) as a function of time t.

The signal x(t) is sampled by a sampling circuit at discrete time instants. The signal x(t) has the initial sample $x_0$ at some time reference t=0. In this illustrative example, the signal x(t) is sampled at three instants. A predicted value is obtained based on two samples, and the difference signal is obtained by taking the difference between the predicted sample and the actual sample. It is contemplated that the technique can be extended for multiple samples, or samples obtained successively in time. The signal x(t) has samples $x_{n-2}$, $x_{n-1}$, and $x_n$ at time instants $t_{n-2}$, $t_{n-1}$ and $t_n$, respectively. From the two samples $x_{n-2}$, $x_{n-1}$, a predicted value $\underline{x}_n$ is obtained using $x_{n-2}$, $x_{n-1}$. The difference signal, or difference sample, $\Delta x_n$ is equal to the difference between the actual sample and the predicted sample two samples $x_n$ and $\underline{x}_n$: $\Delta x_n = x_n - \underline{x}_n$ The prediction, or extrapolation, can be performed using a number of techniques. One technique is to obtain the predicted sample as a linear combination of the previous samples. For example, for a second-order predictor, the predicted sample x can be expressed as:

$$\underline{x}_n = \alpha * x_{n-1} + \beta * x_{n-2} + \gamma \quad (1)$$

where $\alpha$, $\beta$, and $\gamma$ are predictor coefficients.

The linear combination can be expressed for more than two samples and can be represented as follows:

$$\underline{x}_n = a_0 + \Sigma a_1 * x_{n-i} \quad (b\ 2)$$

where $a_i$, i=0, ..., N are the predictor coefficients.

The prediction can also be performed using a non-linear combination of the past samples. Any non-linear relationship can be used, including inverse, logarithmic, exponential, trigonometric, etc. A priori knowledge about the general form of the input signal may also be useful for selecting the proper function or relationship.

The difference signal is stored in the storage array. When the storage array is in the read mode, the difference samples are read and the original input signal is reconstructed using the same structure as the input sampling circuit.

Figure 3:
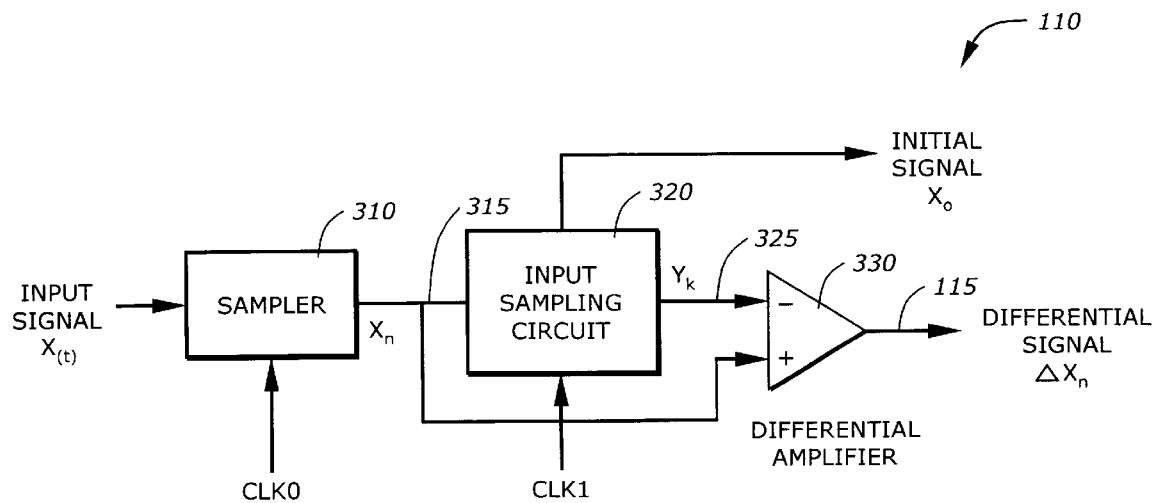
FIG. 3 is a diagram illustrating an input circuit shown in FIG. 1 according to one embodiment of the invention.

FIG. 3 is a diagram illustrating the input circuit 110 shown in FIG. 1 according to one embodiment of the invention. The input circuit 110 includes a sampler 310, an input sampling circuit 320, and a differential amplifier 330.

The sampler 310 samples the input signal x(t) with a clock signal CLK0 to generate the sample $x_n$ 135. The input sampling circuit 320 samples the $x_n$ with a clock signal CLK1 to generate samples $y_k$ 325. The phase relationship between the clock signals CLK0 and CLK1 is such that the timing requirements for the corresponding sampling devices are satisfied. In essence, the input sampling circuit 320 acts like an analog delay circuit that delays the sampled analog signal by an appropriate amount of time and then generates a predicted value of the based on the delayed, or past, samples. In its simplest form, the predicted value is simply the delayed sample itself. In this case, $y_k$ is simply equal to $x_{n-1}$. The sampler 310 therefore generates a first sample of the input signal x(t) at a time instant $t_n$ and the input sampling circuit 320 generates a second sample held at a time instant $t_k$.

The differential amplifier 330 receives the samples $y_k$ and $x_n$ and generates the difference signal $\Delta x_n$ 115 (FIG. 1) which represents a difference between the sample $x_n$ and the sample $y_k$. The difference signal $\Delta x_n$ is then stored in a multilevel storage array 120 (FIG. 1).

Figure 4:
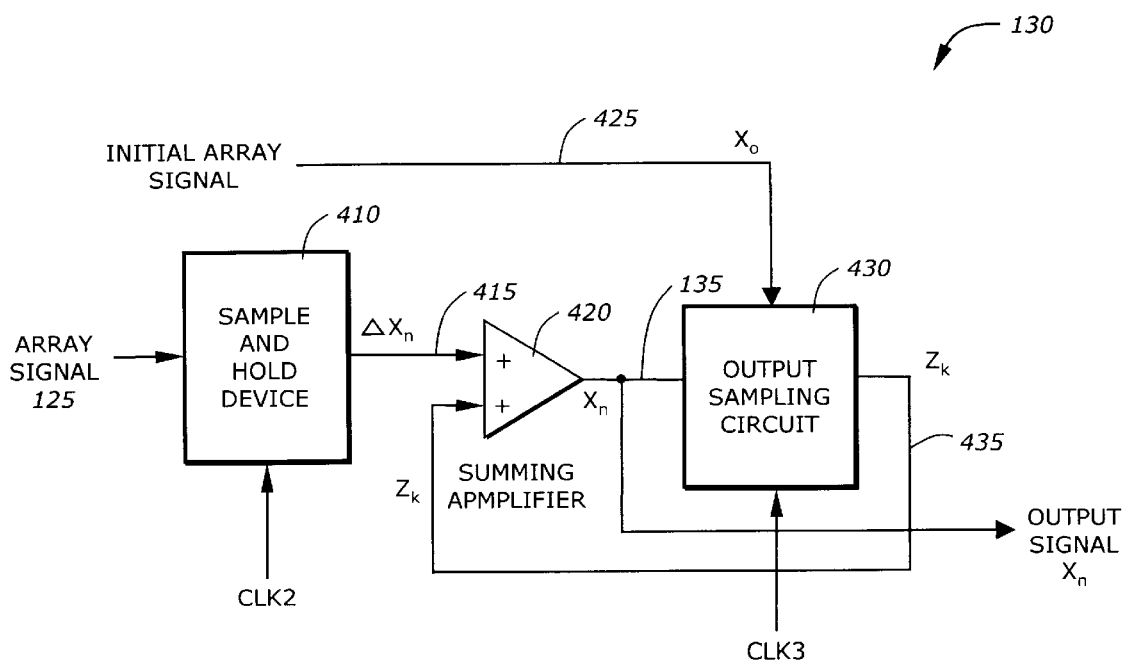
FIG. 4 is a diagram illustrating an output circuit shown in FIG. 1 according to one embodiment of the invention.

FIG. 4 is a diagram illustrating the output circuit 130 shown in FIG. 1 according to one embodiment of the invention. The output circuit 130 includes a sample-and-hold (S/H) device 410, a summing amplifier 420, and an output sampling circuit 430.

The sample and hold device 410 receives the array signal 125 (FIG. 1) from the multilevel storage array 120 when the array is in the read mode. The sample and hold device 410 generates the difference signal $\Delta x_n$ 415 from the multilevel storage array 120 using the clock signal CLK2. The summing amplifier 420 sums the difference signal $\Delta x_n$ 415 with a feedback signal $z_k$ generated by the output sampling circuit 430. The summing amplifier 420 generates the output signal $x_n$ 135, which represents the original input signal samples.

The output sampling circuit 430 receives the output signal $x_n$ 135 and generates the feedback signal $z_k$ 435 using a clock signal CLK3. The clock signals CLK2 and CLK3 are selected such that their timing relationship satisfies the timing requirements for the corresponding sampling devices. The output sampling circuit 430 essentially is the same as the input sampling circuit 320 as shown in FIG. 3. The output sampling circuit 430 also receives the initial array signal x0 425 to use it as the initial sample for the regeneration of the original input samples. The sample and hold device 410 generates the difference signal or sample $\Delta x_n$ 415 at a time instant $t_n$ and the output sampling circuit 430 generates the sample $z_k$ at a time instant $t_k$.

Figure 5A:
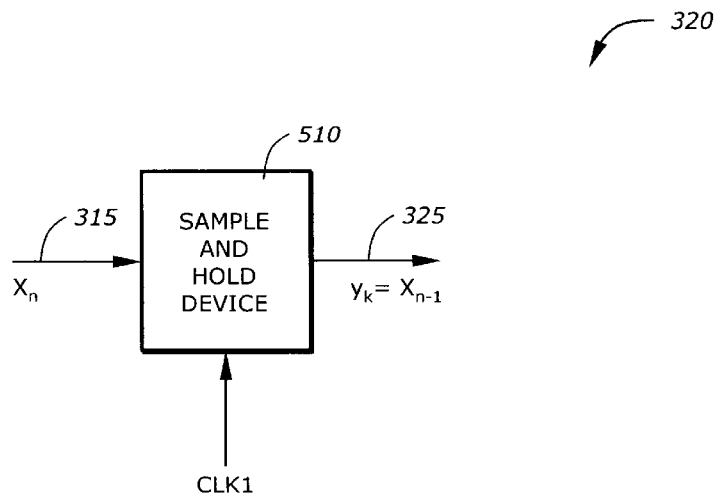
FIG. 5A is a diagram illustrating an input sampling circuit using a sample-and-hold device shown in FIG. 3 according to one embodiment of the invention.
Figure 5B:
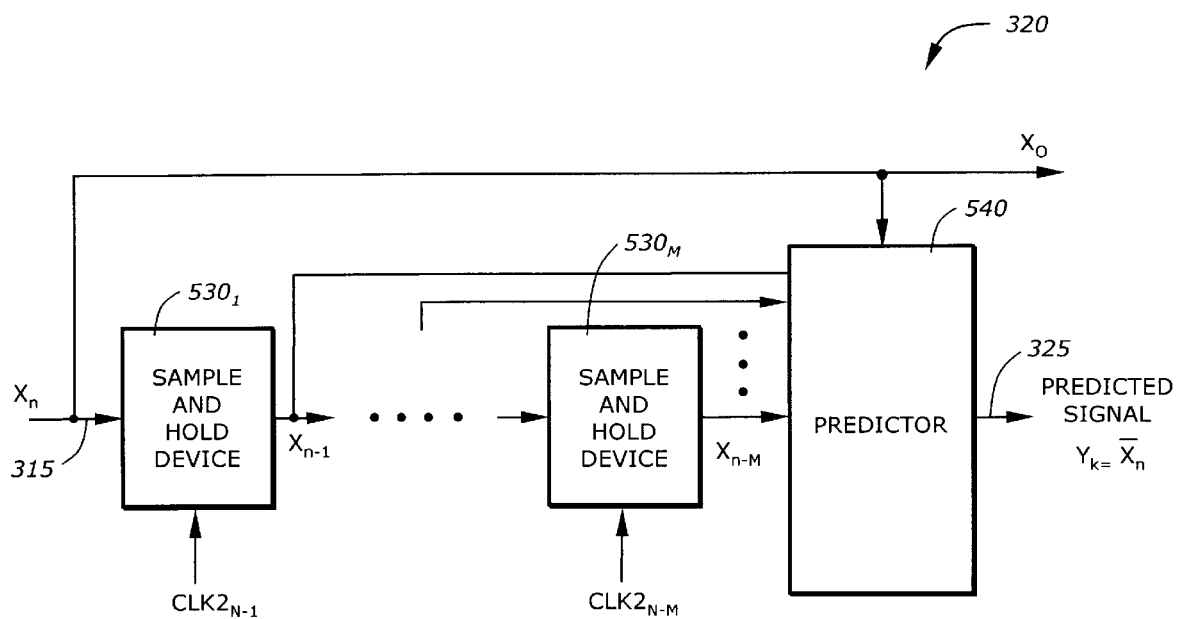
FIG. 5B is a diagram illustrating an input sampling circuit using a predictor shown in FIG. 3 according to one embodiment of the invention.
Figure 6A:
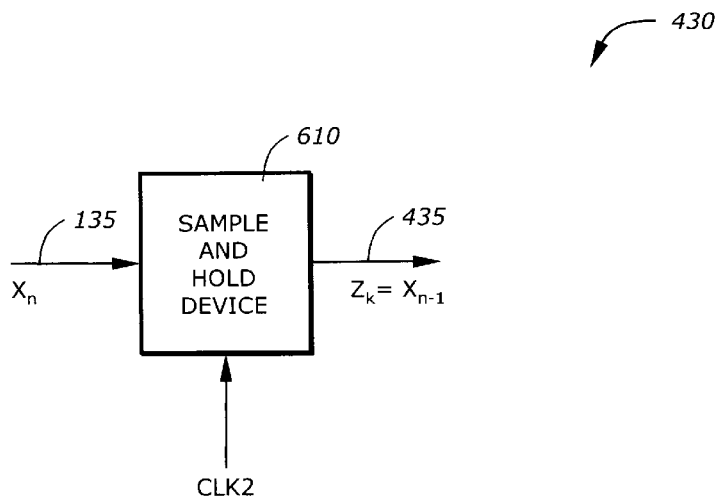
FIG. 6A is a diagram illustrating an output sampling circuit using a sample-and-hold device shown in FIG. 4 according to one embodiment of the invention.
Figure 6B:
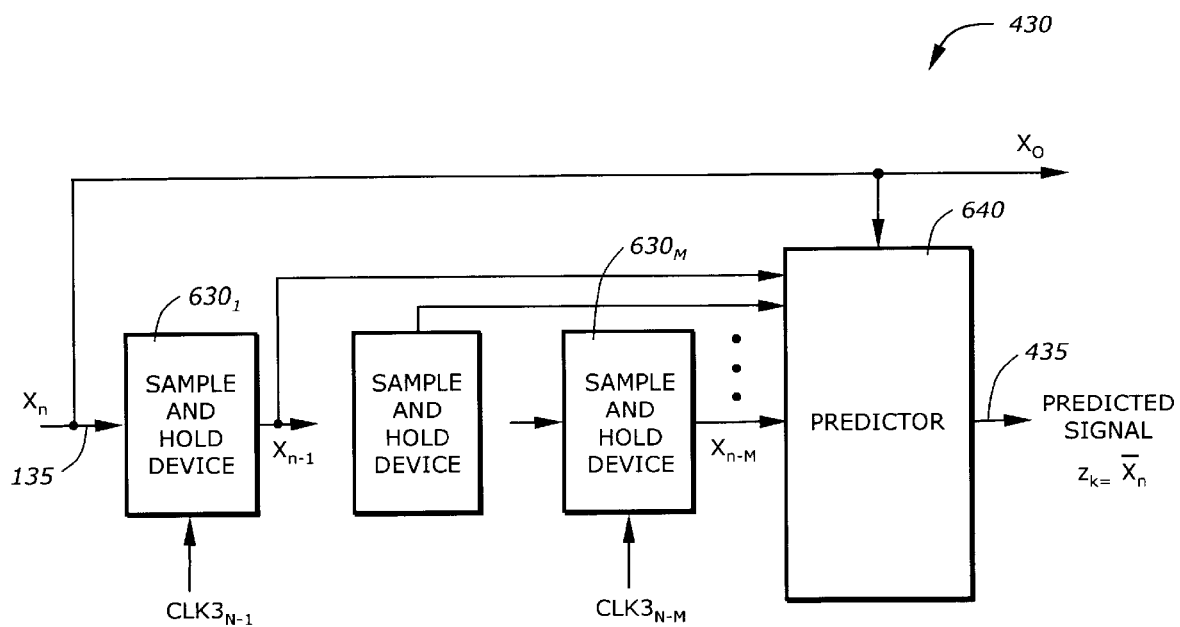
FIG. 6B is a diagram illustrating an output sampling circuit using a predictor shown in FIG. 4 according to one embodiment of the invention.

The input sampling circuit 320 and the output sampling circuit 430 are essentially the same. The structure of these circuits depends on the type of prediction technique. In one embodiment, the predicted sample is the past sample as illustrated in FIG. 2A. In this case the input sampling circuit 320 is shown in FIG. 5A and the corresponding output sampling circuit 430 is shown in FIG. 6A. In another embodiment, the prediction is an extrapolated sample based on the past samples as illustrated in FIG. 2B. In this case the input sampling circuit 320 is shown in FIG. 5B and the corresponding output sampling circuit 430 is shown in FIG. 6B. Note that if no prediction is used, the circuit degenerates into circuit shown in FIG. 3 or FIG. 5A.

FIG. 5A is a diagram illustrating the input sampling circuit 320 using a sample-and-hold device shown in FIG. 3 according to one embodiment of the invention. The input sampling circuit 320 includes a sample and hold device 510.

The sample and hold device 510 receives the sample $x_n$ 315 and generates the sample $y_k$ using a clock signal CLK1. Since the sample and hold device 510 delays the sample $x_n$ 315 by a clock period, the sample $y_k$ 325 is equal to $x_{n-1}$.

FIG. 5B is a diagram illustrating the input sampling circuit 320 using a predictor shown in FIG. 3 according to one embodiment of the invention. The input sampling circuit 320 includes M sample-and-hold devices $530_1$ to $530_M$ and a predictor 540.

The M sample-and-hold devices $530_1$ to $530_M$ are coupled to one another in a serial chain to sample the sample $x_n$ 315 at the clock signals CLK2N−1, . . . , CLK2N−M, respectively, and generate a plurality of successive samples $x_{n-1} \ldots x_{n-M}$. These successive samples $x_{n-1}, \ldots, x_{n-M}$ correspond to the sampled input signal held at a corresponding plurality of time instants $t_{n-1}, \ldots, t_{n-M}$. The clock signals CLK2N−1, . . . , CLK2N−M, are selected such that the timing requirements for the respective sample-and-hold devices are satisfied.

The predictor 540 receives the sample $X_n$ 315 and M samples from the M sample-and-hold devices $530_1$ to $530_M$ to generate a predicted sample $y_k$ using a combination of the samples $x_n$ and the plurality of successive samples $x_{n-1}, \ldots, x_{n-M}$. The sample $y_k$ is the predicted sample $x_n$ as illustrated in FIG. 2B.

FIG. 6A is a diagram illustrating the output sampling circuit 430 shown in FIG. 4 using a sample-and-hold device according to one embodiment of the invention. The output sampling circuit 430 includes a sample-and-hold device 610.

The sample-and-hold device 610 is used in the output sampling circuit 430 when the input sampling circuit 320 uses the sample-and-hold device 510 as shown in FIG. 5A. The sample-and-hold device 610 samples the input sample $x_n$ 135 using a clock signal CLK2 to generate the sample $z_k$ 435. Since the sample-and-hold device 610 delays the sample $x_n$ 315 by a clock period, the sample $z_k$ 435 is equal to $x_{n-1}$.

FIG. 6B is a diagram illustrating the output sampling circuit 430 shown in FIG. 4 using a predictor according to one embodiment of the invention. The output sampling circuit 430 in this embodiment corresponds to the input sampling circuit 320 shown in FIG. 5B. The output sampling circuit 430 includes M sample-and-hold devices $630_1$ to $630_M$ and a predictor 640.

The M sample-and-hold devices $630_1$ to $630_M$ are coupled to one another in a serial chain to sample the sample $x_n$ 135 at the clock signals CLK3N−1, . . . , CLK3N−M, respectively, and generate a plurality of successive samples $x_{n-1}, \ldots x_{n-M}$. These successive samples $x_{n-1}, \ldots x_{n-M}$ correspond to the sampled input signal held at a corresponding plurality of time instants $t_{n-1}, \ldots, t_{n-M}$. The clock signals CLK3N−1, . . . , CLK3N−M, are selected such that the timing requirements for the respective sample-and-hold devices are satisfied.

The predictor 640 receives the sample $x_n$ 135 and M samples from the M sample-and-hold devices $630_1$ to $630_M$ to generate a predicted sample $z_k$ using a combination of the samples $x_n$ and the plurality of successive samples $x_{n-1}, \ldots, x_{n-M}$. The sample $z_k$ is the predicted sample $x_n$ as illustrated in FIG. 2B.

Figure 7:
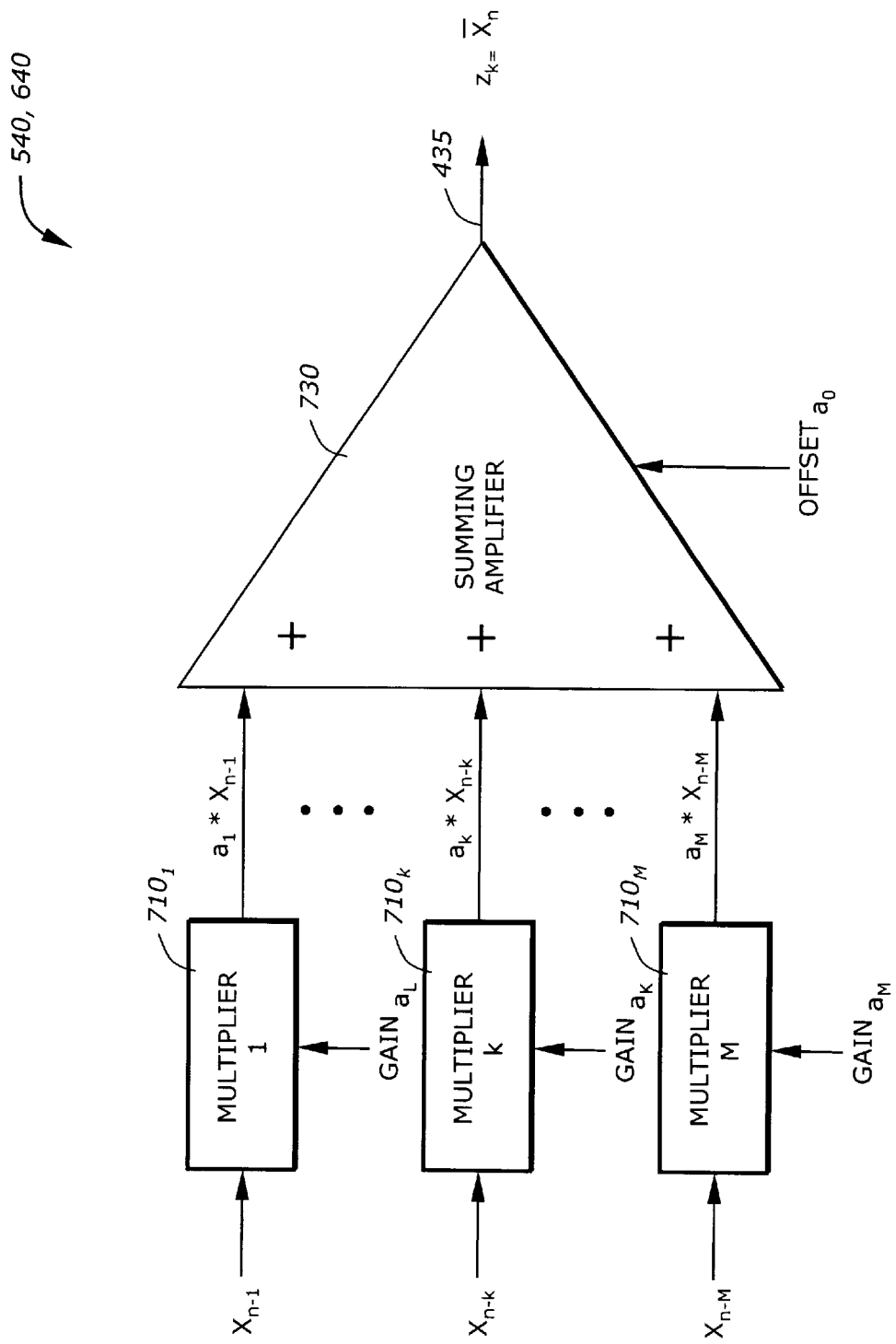
FIG. 7 is a diagram illustrating a predictor shown in FIGS. 5B and 6B according to one embodiment of the invention.

FIG. 7 is a diagram illustrating the predictor 540 and 640 shown in FIGS. 5B and 6B, respectively, according to one embodiment of the invention. The predictor 540 or 640 includes multipliers 710 and 720 and a summing amplifier 730.

The predictor 540 or 640 essentially performs an N-order linear combination given in equation (2). For N=2, the predictor 540 or 640 performs a second-order linear combination given in equation (1).

The multiplier $710_1$ multiplies the sample $x_{n-1}$ by a gain $a_1$ to generate a scaled sample $a_1 * x_{n-1}$. The gain $a_1$ can be selected according to the weight on sample $x_{n-1}$. The gain $a_1$ may be provided by a resistor network. Alternatively, the multiplier $710_1$ may be implemented as a programmable gain amplifier where $a_1$ is the gain. Similarly, the multiplier $710_k$ multiplies the sample $x_{n-k}$ by a gain $a_k$ to generate a scaled sample $a_k * x_{n-k}$. The gain $a_k$ can be selected according to the weight on sample $x_{n-k}$. The gain $a_k$ may be provided by a resistor network. Alternatively, the multiplier $710^k$ may be implemented as a programmable gain amplifier where $a_k$ is the gain.

The summing amplifier 730 sums the scaled samples $a_1 * x_{n-1}, a_2 * x_{n-21} \ldots, a_m * x_{n-m}$ with an offset $a_0$ to generate the predicted sample 435 $z_k = x_n$. The offset $a_0$ may be provided by a resistor or resistor network.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a sampler to sample an input signal, the sampler generating a first sample of an input signal at a first time instant;
   a circuit coupled to the sampler to generate a second sample, the second sample being the sampled input signal held at a second time instant; and
   a differential amplifier coupled to the circuit and the sampler to generate a difference signal representing a difference between the first sample and the second sample, the difference signal being stored in a multi-level storage array, wherein the multilevel storage array stores an initial sample in a storage row.

2. The apparatus of claim 1 wherein the circuit comprises:
   a sample-and-hold device to generate the second sample by holding the sampled input signal at the second time instant.

3. The apparatus of claim 1 wherein the circuit comprises:
   a plurality of sample-and-hold devices coupled to one another in a serial chain to generate a plurality of successive samples, the successive samples being the sampled input signal held at a corresponding plurality of time instants; and
   a predictor coupled to the plurality of sample-and-hold devices and the sampler to generate the second sample using a combination of the first and the plurality of successive samples.

4. The apparatus of claim 3 wherein the predictor comprises:
   a linear combiner to linearly combine the successive samples using a linear expression, the linearly combined successive samples corresponding to the second sample.

5. The apparatus of claim 3 wherein the predictor comprises:
   a non-linear combiner to non-linearly combine the successive samples using a non-linear expression, the non-linearly combined successive samples corresponding to the second sample.

6. The apparatus of claim 1 wherein the circuit comprises:
a first sample-and-hold device to generate a third sample, the third sample being the sampled input signal held at a third time instant;
a second sample-and-hold device coupled to the first sample-and-hold device to generate a fourth sample, the fourth sample being the sampled input signal held at a fourth time instant; and
a predictor coupled to the first and second sample-and-hold devices and the sampler to generate the second sample using a combination of the first, third and fourth samples.

7. The apparatus of claim 6 wherein the predictor comprises:
a linear combiner to linearly combine the third and fourth samples using a linear expression, the linearly combined third and fourth samples corresponding to the second sample.

8. The apparatus of claim 6 wherein the predictor comprises:
a non-linear combiner to non-linearly combine the third and fourth samples using a non-linear expression, the non-linearly combined third and fourth samples corresponding to the second sample.

9. The apparatus of claim 7 wherein the linear combiner comprises:
a first multiplier to multiply the third sample with a first gain to generate a first scaled sample;
a second multiplier to multiply the fourth sample with a second gain to generate a second scaled sample; and
a summing amplifier to sum the first and second scaled samples with an offset to generate the second sample.

10. A method comprising:
sampling an input signal by a sampler to generate a first sample of an input signal at a first time instant;
generating a second sample by an circuit, the second sample being the sampled input signal held at a second time instant; and
generating a difference signal representing a difference between the first sample and the second sample by a differential amplifier, the difference signal being stored in a multilevel storage array, wherein the multilevel storage array stores an initial sample in a storage row.

11. The method of claim 10 wherein generating the second sample comprises:
generating the second sample by holding the sampled input signal at the second time instant by a sample-and-hold device.

12. The method of claim 10 wherein generating the second sample comprises:
generating a plurality of successive samples by a plurality of sample-and-hold devices coupled to one another in a serial chain, the successive samples being the sampled input signal held at a corresponding plurality of time instants; and
generating the second sample by a predictor using a combination of the first and the plurality of successive samples.

13. The method of claim 12 wherein generating the second sample by a predictor comprises:
linearly combining the successive samples using a linear expression, the linearly combined successive samples corresponding to the second sample.

14. The method of claim 10 wherein generating the second sample by a predictor comprises:
non-linearly combining the successive samples using a non-linear expression, the non-linearly combined successive samples corresponding to the second sample.

15. The method of claim 10 wherein generating the second sample by the circuit comprises:
generating a third sample by a first sample-and-hold device, the third sample being the sampled input signal held at a third time instant;
generating a fourth sample by a second sample-and-hold device, the fourth sample being the sampled input signal held at a fourth time instant; and
generating the second sample by a predictor using a combination of the first, third and fourth samples.

16. The method of claim 15 wherein generating the second sample by the predictor comprises:
linearly combining the third and fourth samples using a linear expression, the linearly combined third and fourth samples corresponding to the second sample.

17. The method of claim 15 wherein generating the second sample by the predictor comprises:
non-linearly combining the third and fourth samples using a non-linear expression, the non-linearly combined third and fourth samples corresponding to the second sample.

18. The method of claim 16 wherein linearly combining comprises:
multiplying the third sample with a first gain to generate a first scaled sample;
multiplying the fourth sample with a second gain to generate a second scaled sample; and
summing the first and second scaled samples with an offset to generate the second sample.

19. A system comprising:
a multilevel storage array; and
an input circuit coupled to the multilevel storage array, the input circuit comprising:
a sampler to sample an input signal, the sampler generating a first sample of an input signal at a first time instant,
a circuit coupled to the sampler to generate a second sample, the second sample being the sampled input signal held at a second time instant, and
a differential amplifier coupled to the circuit and the sampler to generate a difference signal representing a difference between the first sample and the second sample, the difference signal being stored in the multilevel storage array, wherein the multilevel storage array stores an initial sample in a storage row.

20. The system of claim 19 wherein the circuit comprises:
a sample-and-hold device to generating the second sample by holding the sampled input signal at the second time instant.

21. The system of claim 19 wherein the circuit comprises:
a plurality of sample-and-hold devices coupled to one another in a serial chain to generate a plurality of successive samples, the successive samples being the sampled input signal held at a corresponding plurality of time instants; and
a predictor coupled to the plurality of sample-and-hold devices and the sampler to generate the second sample using a combination of the first and the plurality of successive samples.

22. The system of claim 21 wherein the predictor comprises:
a linear combiner to linearly combine the successive samples using a linear expression, the linearly com bined successive samples corresponding to the second sample.

23. The system of claim 21 wherein the predictor comprises:

a non-linear combiner to non-linearly combine the successive samples using a non-linear expression, the non-linearly combined successive samples corresponding to the second sample.

24. The system of claim 19 wherein the circuit comprises:

a first sample-and-hold device to generate a third sample, the third sample being the sampled input signal held at a third time instant;

a second sample-and-hold device coupled to the first sample-and-hold device to generate a fourth sample, the fourth sample being the sampled input signal held at a fourth time instant; and a predictor coupled to the first and second sample-and-hold devices and the sampler to generate the second sample using a combination of the first, third and fourth samples.

25. The system of claim 24 wherein the predictor comprises:

a linear combiner to linearly combine the third and fourth samples using a linear expression, the linearly combined third and fourth samples corresponding to the second sample.

26. The system of claim 24 wherein the predictor comprises:

a non-linear combiner to non-linearly combine the third and fourth samples using a non-linear expression, the non-linearly combined third and fourth samples corresponding to the second sample.

27. The system of claim 25 wherein the linear combiner comprises:

a first multipler to multiply the third sample with a first gain to generate a first scaled sample;

a second multiplier to multiply the fourth sample with a second gain to generate a second scaled sample; and a summing amplifier to sum the first and second scaled samples with an offset to generate the second sample.

* * * * *